United States Patent [19]

Flanagan et al.

[11] 4,071,695

[45] Jan. 31, 1978

[54] SPEECH SIGNAL AMPLITUDE EQUALIZER

[75] Inventors: James Loton Flanagan, Warren; Susan Anne Webber, North Plainfield, both of N.J.

[73] Assignee: Bell Telephone Laboratories, Incorporated, Murray Hill, N.J.

[21] Appl. No.: 713,930

[22] Filed: Aug. 12, 1976

[51] Int. Cl.² .................. H03G 7/00; H03G 11/04
[52] U.S. Cl. .................. 179/1 VL; 179/1 P
[58] Field of Search ............ 179/1 P, 1 VC, 1 SC, 179/1 F, 1 VL, 84 VF, 15.55 R; 325/400–410, 182, 187; 328/168–175; 332/38

[56] References Cited

U.S. PATENT DOCUMENTS

| | | | |
|---|---|---|---|
| 2,799,734 | 7/1957 | Camp | 330/132 |
| 3,020,352 | 2/1962 | De Jager | 179/15.55 |
| 3,024,313 | 3/1962 | Ensink | 179/15.55 |
| 3,323,066 | 5/1967 | Kurtz | 325/403 |
| 3,327,063 | 6/1967 | Remley | 179/15.55 |
| 3,350,650 | 10/1967 | Kemper | 179/1 P |
| 3,620,631 | 11/1971 | Stopka | 325/404 |
| 3,789,143 | 1/1974 | Blackmer | 179/15.55 |
| 3,821,482 | 6/1974 | Hirsch | 179/15.55 |
| 3,855,423 | 12/1974 | Brendzel | 179/15.55 |
| 3,873,925 | 3/1975 | Eastmond | 325/402 |
| 3,970,786 | 7/1976 | Randmere | 179/1 VC |

OTHER PUBLICATIONS

J. Dugundji, "Envelopes and Pre-Envelopes . . .", IEEE Trans. Info., Theory, Mar. 1958.

*Primary Examiner*—Kathleen H. Claffy
*Assistant Examiner*—E. S. Kemeny
*Attorney, Agent, or Firm*—J. S. Cubert

[57] ABSTRACT

A speech signal amplitude equalizer (compressor) circuit normalizes the amplitude variations of a real-time input speech signal s(t) to form the normalized output signal r(t) which may be either of two values: a constant amplitude (unilevel) speech signal or a zero-amplitude (squelched) signal. The normalized output signal $r(t) = s(t)/a(t) + K$ where the envelope signal $a(t) = s^2(t) + \hat{s}^2(t)$ in which $\hat{s}^2(t)$ is the Hilbert transform and K is a control signal which can take one of two levels depending upon the amplitude of the envelope signal being above or below certain thresholds in a hysteresis type logic circuit.

20 Claims, 10 Drawing Figures

SPEECH SIGNAL AMPLITUDE EQUALIZER

BACKGROUND OF THE INVENTION

Our invention relates to communication systems and more particularly to the automatic conditioning of speech and other other information signals for transmission.

In speech and similar type communication systems it is often desirable to automatically adjust the input speech so that signal transmission over a prescribed communication channel is optimized. Signal amplitude equalization, for example, is effective to reduce the dynamic range of the transmitted signal whereby the level of relatively weak signals is raised to that of a relatively strong signal. Such conditioning results in reduced vulnerability to noise. Where the communication signal incorporates an amplitude modulated transmitter having limited peak modulation capability, automatic signal amplitude equalization increases the average level of the equalized modulating signal to a high level within the modulation capability of the transmitter so that greater side-band power is available.

In one type of priorly known automatic signal amplitude adjustment arrangement, the input signal is filtered to obtain a control signal representative of the long-term signal amplitude level. The control signal is then used to adjust the input signal amplitude. Such arrangements are effective to equalize signal amplitude over syllabic or longer time intervals, but are relatively ineffective over shorter time intervals. Another well-known amplitude control arrangement utilizes peak clippers, instantaneous compandors, or non-uniform or adaptive quantizers to effect control over very short duration signal variations but the degree of equalization is limited and longer term signal changes are not fully compensated. Yet another well-known amplitude equalizing scheme uses linear filtering with high frequency emphasis to minimize the amplitude differences between lower frequency voiced speech segments and higher frequency unvoiced speech segments occuring in intermediate range time intervals. All of these priorly known arrangements, however, include time-dependent or frequency-dependent control functions which limit the range of automatic signal amplitude adjustment.

It is an object of the invention to provide improved signal amplitude equalization operative over an extensive range of time intervals.

It is another object of the invention to transform an input speech-type signal into an intelligible, substantially unilevel signal of low distortion.

BRIEF SUMMARY OF THE INVENTION

The invention is directed to a signal conditioning arrangement wherein a signal representative of the envelope of an input speech-type signal is generated. Responsive to said envelope-representative signal, a level signal is produced which assumes a first value when the envelope-representative signal exceeds a first threshold and assumes a second value when the envelope-representative signal decreases below a second lower threshold. The envelope-representative and level signals are combined to form an envelope-responsive control signal. The input signal is divided by the envelope responsive control signal to provide an intelligible output signal of controlled amplitude.

According to one aspect of the invention, the first value of the level signal is relatively low compared to the second value of the level signal, whereby the output signal is substantially attenuated responsive to envelope-representative signals below said second threshold.

According to yet another aspect of the invention, the threshold values and the level values are adjusted responsive to the maximum value of the envelope-representative signal.

According to yet another aspect of the invention, the envelope-representative signal is formed by generating the Hilbert transform of the input signal and deriving a signal representative of the square root of the sum of the square of the input signal and the square of the Hilbert transform of the input signal.

According to yet another aspect of the invention, the envelope-representative signal is formed by complex modulation of the input signal into orthogonal components and derivation of a signal representative of the square root of the sum of the squares of said orthogonal components.

According to yet another aspect of the invention, the abrupt transitions of the output signal resulting from threshold changes between the substantially unilevel output signal and the attenuated output are detected to define the beginning and end of the input signal and pauses therein.

According to still another aspect of the invention, a replica of the input signal is reconstructed by forming the product of said output signal and said envelope-representative signal.

DETAILED DESCRIPTION

Figure 1:
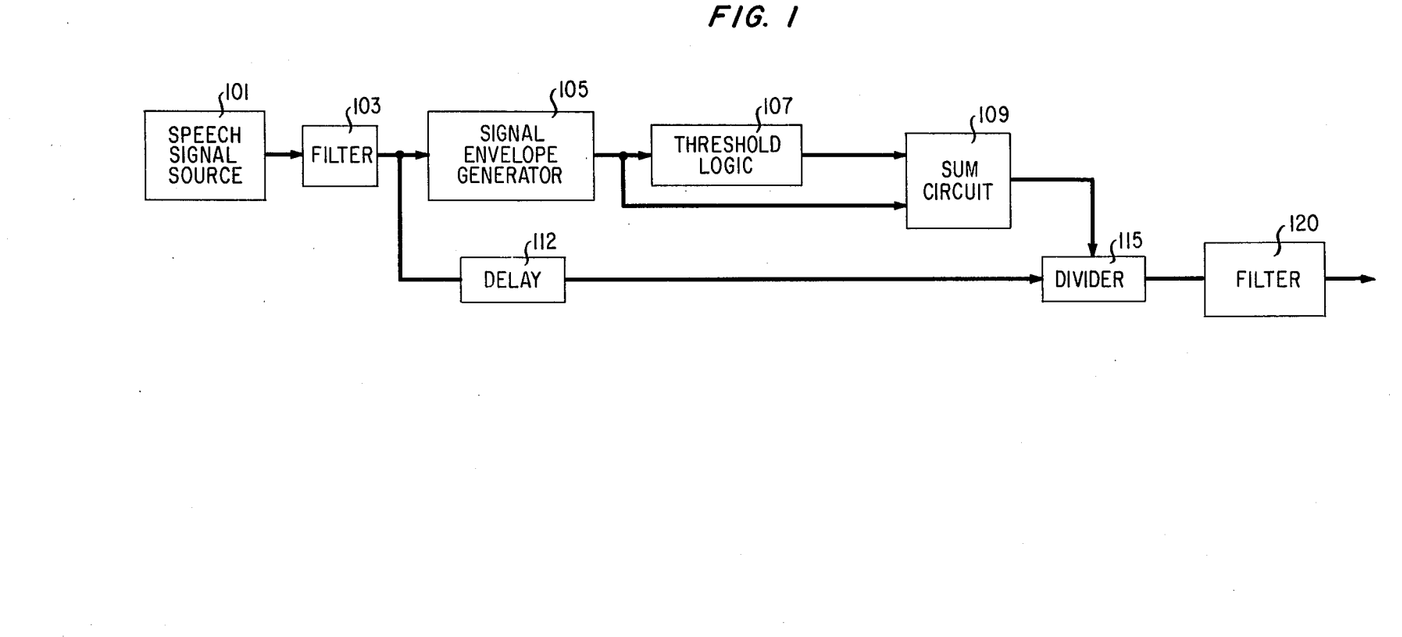
FIG. 1 depicts a general block diagram of a signal conditioner illustrative of the invention.

FIG. 1 shows a signal conditioner circuit adapted to automatically adjust the amplitude of an incoming speech-like signal. In FIG. 1, signal source 101, which may comprise an electroacoustic transducer and associated networks, produces a speech-like electrical signal $s(t)$. Filter 103 is operative to limit the bandwidth of signal $s(t)$, and the bandwidth limited output therefrom is applied to envelope generator 105. The bandwidth limited signal $s(t)$ can be considered to be the real part of an analytic signal $$\sigma(t) = a(t)e^{j\Phi(t)} \quad (1)$$

where $a(t)$ is the instantaneous amplitude of $\sigma(t)$ and $\Phi(t)$ is the instantaneous phase of $\sigma(t)$. $a(t)$ forms the envelope of the analytic signal which has real part, $s(t) = a(t)\cos\Phi(t)$ in accordance with the general description of an envelope signal in the article "Envelopes and Pre-Envelopes of Deal Waveforms" by J. Dugundji *IRE Transactions on Information Theory*, March 1958, pages 53–57. Generator 105 is operative to produce the envelope signal $a(t)$ responsive to the bandwidth limited signal $s(t)$ from band-pass filter 103. Threshold logic 107 receives the envelope signal $a(t)$ and provides a first constant value output $k_1$ when signal $a(t)$ increases above threshold $T_1$ and provides a second constant value output $k_2$ when envelope signal $a(t)$ decreases below a threshold value $T_2 < T_1$. $T_1$ is selected to be the minimum anticipated envelope signal level, and threshold $T_2$ may be selected to correspond to the maximum background noise level. Thresholds $T_1$ and $T_2$ may be proportional to the maximum of the envelope signal $a(t)$.

The envelope signal $a(t)$ from generator 105 and the constant value output of logic circuit 107 are applied to the inputs of sum circuit 109 which produces the signal corresponding to $$a(t) + K \quad (2)$$

where $K = k_1 << a(t)$ for $a(t) > T_1$ and $K = k_2 >> a(t)$ for $a(t) < T_2$.

Divider circuit 115 receives the output of sum circuit 109 and the delayed bandwidth limited signal $s(t)$ from delay 112. The bandwidth limited signal $s(t)$ is delayed by delay 112 for a time corresponding to the response time of the circuit path including generator 105, threshold logic circuit 107, and sum circuit 109. Divider circuit 115 is operative responsive to the delayed signal $s(t)$ and the modified envelope signal from sum circuit 109 to form an output signal $$r(t) = s(t)/a(t)+K \quad (3)$$

When the envelope signal $a(t)$ increases above threshold $T_1$, the output signal $r(t)$ is substantially constant in amplitude, since the amplitude of signal $s(t)$ at the input of divider circuit 115 is substantially the same as the amplitude of envelope signal $a(t)$, and $k_1$ is much smaller than the envelope signal $a(t)$. When $a(t)$ decreases below threshold $T_2$, the output signal $r(t)$ is substantially attenuated since $k_2$ is much greater than the maximum value of the envelope signal $a(t)$. The signal $r(t)$ from divider 115 is applied to filter 120 which is operative to limit the bandwidth of signal $r(t)$ to the original signal bandwidth 0–W Hz and to eliminate unwanted higher frequency components.

Figure 8:
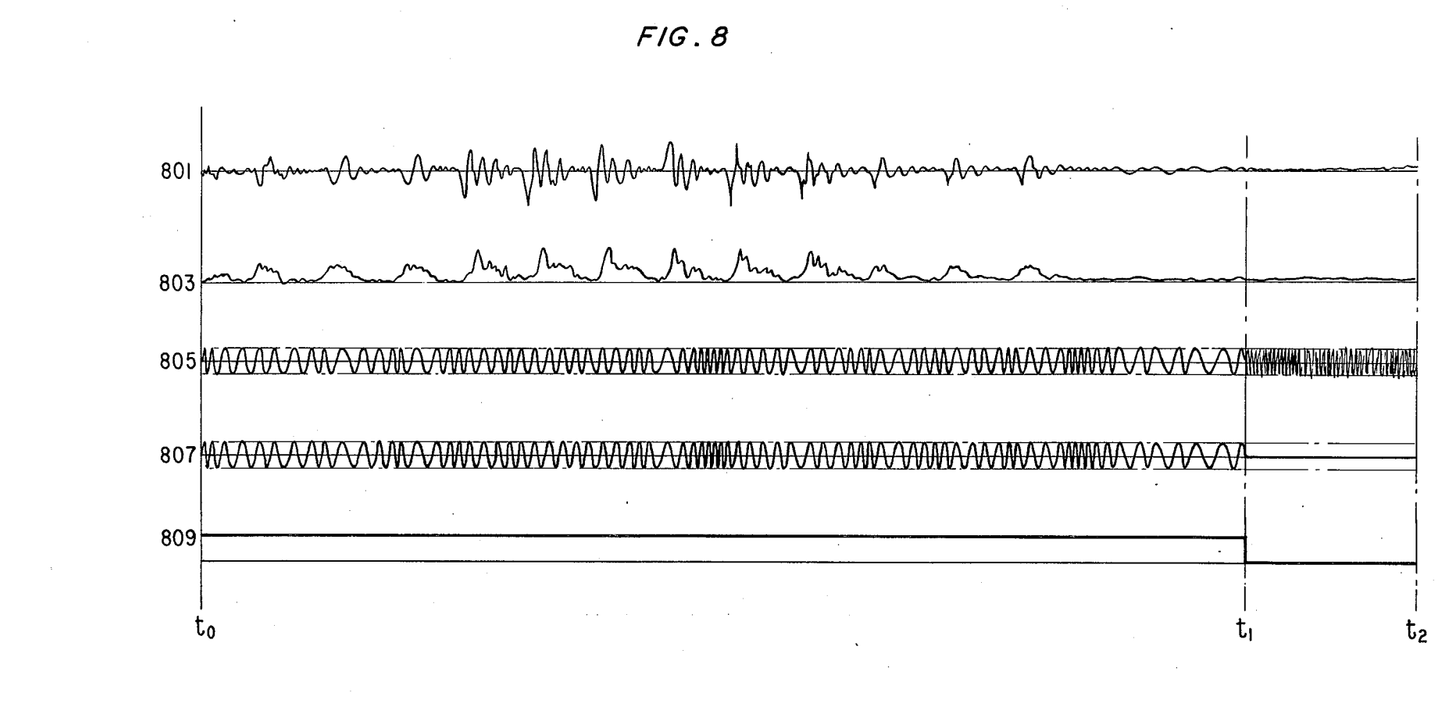
FIG. 8 shows signal waveforms useful in describing the circuits of FIGS. 1 and 2.

FIG. 8 shows representative waveforms obtained in the operation of the circuit of FIG. 1. Waveform 801 represents a speech signal $s(t)$ at the output of filter 103 between $t_0$ and $t_1$ and background noise between $t_1$ and $t_2$. Waveform 803 shows the envelope signal $a(t)$ corresponding to the speech signal waveform 801 obtained from the output of generator 105. Waveform 805 represents $s(t)/a(t)$. During the speech signal between times $t_0$ and $t_1$, waveform 805 is substantially unilevel as desired. Between $t_1$ and $t_2$, however, the background noise is amplified to the same level. The signal $r(t)$ obtained from filter 120 is shown in waveform 807. Since the instantaneous amplitude of speech signal $s(t)$ is substantially equal to the instantaneous amplitude of envelope signal $a(t)$, signal $r(t)$ shown in waveform 807 has substantially constant amplitude during all periods of speech signal input, e.g., $t_0$ to $t_1$. In periods of silence, or in the absence of a speech signal, e.g.. $t_1$ to $t_2$, signal $r(t)$ is substantially zero, owing to the operation of threshold circuit 107.

In accordance with the invention, the circuit of FIG. 1 is operative to transform an input speech signal into a substantially constant amplitude or unilevel signal and to discriminate against noise. High-level portions of an input speech signal are reduced, while low-level portions of the input speech signal are amplified. Advantageously, low-level, high-frequency voiceless sounds, such as low-level consonants, are raised in amplitude without affecting the discrimination between speech signals and background noise. Further, the amplitude adjusted output signal $r(t)$ from band-pass filter 120 is a highly intelligible signal which may be used directly in a communication system.

Figures 2A, 2B:
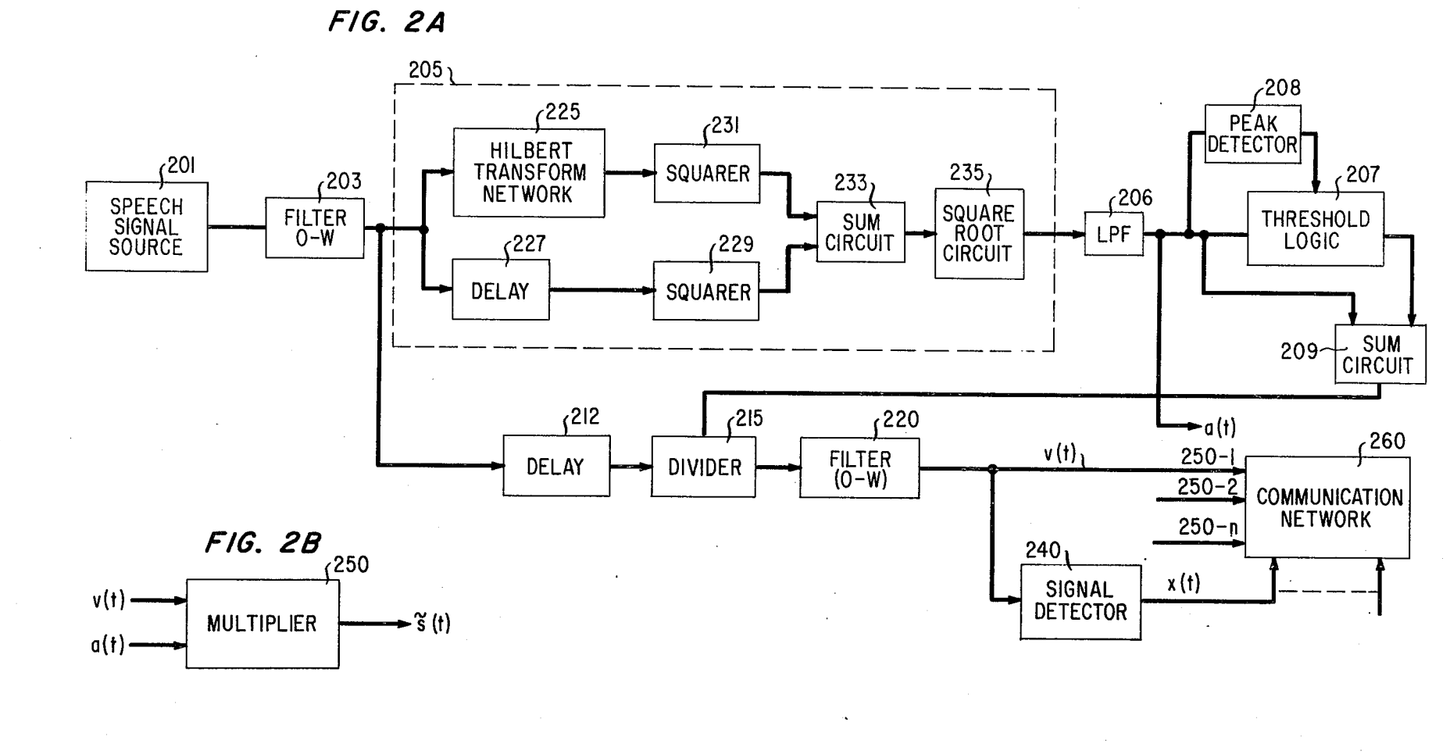
FIG. 2A depicts a block diagram of a signal amplitude adjustment circuit illustrative of the invention in which a Hilbert transform network is utilized.
FIG. 2B depicts a block diagram of a circuit to reconstruct a replica of the unconditioned signal from FIG. 2A.

FIG. 2 shows an automatic signal amplitude equalizer circuit in which a Hilbert transform network is utilized to produce envelope signal $a(t)$. In FIG. 2, speech signal source 201 is operative to supply speech signal $s(t)$ to filter circuit 203. Filter 203 limits the bandwidth of signal $s(t)$ to the range between O and W Hz, where W Hz is an upper frequency limit suitable for speech transmission. Filter 203 may also be a bandpass filter limiting the bandwidth of $s(t)$ to $W_1$ to $W_2$ Hz in the audio range. The output of filter 203 shown in waveform 801 is supplied to the input of envelope generator 205.

Generator circuit 205 includes Hilbert transform network 225, delay 227, squarer circuits 229 and 231, sum circuit 233, and square root circuit 235. As is well known in the art, the envelope of the analytic signal of which $s(t)$ is the real part may be represented as $$a(t) = + \sqrt{s^2(t)+\hat{s}^2(t)} \quad (4)$$

where $\hat{s}(t)$ is the Hilbert transform of $s(t)$.

$$\hat{s}(t) = \frac{1}{\pi} \int_{-\infty}^{\infty} \frac{s(\lambda)}{(t-\lambda)} d\lambda \quad (5)$$

As is well known in the art, the signal $\hat{s}(t)$ corresponds to the imaginary part of the analytic signal of which $s(t)$ is the real part. Thus, the formation of the envelope signal $a(t)$ may be accomplished by forming a signal $\hat{s}(t)$ corresponding to the Hilbert transform of the input speech signal; adding the squares of the Hilbert transform signal and the speech signal; and deriving the positive square root of the sum of the squares in accordance with Equation 4.

In generator circuit 205, the bandwidth limited input speech signal $s(t)$ is applied to Hilbert transform network 225 and to delay 227. Hilbert transform network 225 may be of the type described in U.S. Pat. No. 3,484,556, issued to J. L. Flanagan et al on Dec. 16, 1969, or may comprise a charge coupled device well known in the art and adapted to perform the Hilbert transformation. The output of transform network 225 is applied to squarer circuit 231 which is operative to form a signal corresponding to $\hat{s}^2(t)$. Delay 227 is adjusted to delay signal $s(t)$ by a period equal to the delay through transform circuit 225 whereby squarer circuit 229 provides delayed signal $\hat{s}^2(t)$.

Sum circuit 233 receives signal $s^2(t)$ from squarer circuit 231 and signal $\hat{s}^2(t)$ from squarer circuit 229 and is operative to form the signal equal to $$a^2(t) = s^2(t) + \hat{s}^2(t) \tag{6}$$

The output of sum circuit 233 is applied to square root circuit 235 which forms the positive square root of the signal $a(t)$ in accordance with Equation (4). This signal represents the envelope $a(t)$ of the input speech signal $s(t)$.

The output of square root circuit 235 is passed through low-pass filter 206 to limit the bandwidth of $a(t)$. The operations performed in squarers 229 and 231 result in a bandwidth of 0 to 2W Hz for signals $s^2(t)$ and $\hat{s}^2(t)$. The square rooting operation in circuit 235 does not necessarily limit the bandwidth to 0 to W. Low-pass filter 206 is used to limit the bandwidth of the envelope signal. The bandwidth may be limited to 0 to W Hz or, alternatively, the bandwidth may be further limited to modify, average, or time smooth the resulting amplitude adjusted signal.

Figure 4:
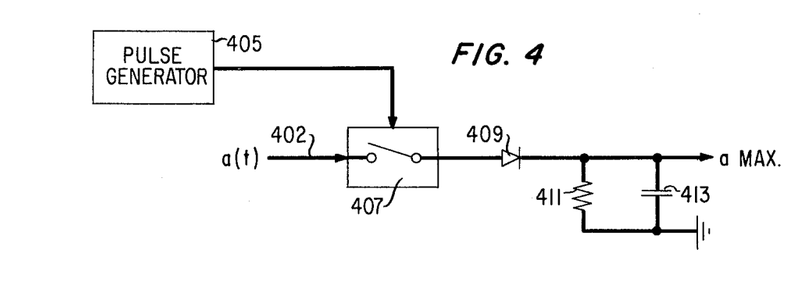
FIG. 4 shows an envelope signal peak detector which may be used in the signal amplitude adjustment circuit of FIG. 2.

The bandwidth limited signal $a(t)$ is supplied to peak detector 208, which is shown in greater detail in FIG. 4. Referring to FIG. 4, the envelope signal from low-pass filter 206 is applied via lead 402 to switch 407, which switch is controlled by pulse generator 405. Switch 407 samples the envelope signal $a(t)$ in accordance with the pulse sequence of pulse generator 405. Pulse generator 405 is operative to sample the portion of the envelope signal in a selected time interval. The selected time interval may be at the beginning of an input speech signal, whereby an estimate of the maximum envelope signal $a_{max}$ can be obtained, or, alternatively, pulse generator 405 may be operative to periodically close switch 407 so that the envelope signal $a_{max}$ may be periodically updated. Switch 407 is connected to paralleled capacitor 413 and resistor 411 through diode 409. In this manner, the maximum value of envelope signal is stored on capacitor 413, but leakage back through switch 407 is prevented. Resistor 411 allows slow discharge of capacitor 413 and is selected to be high valued so that $a_{max}$ is stored between successive closings of switch 407.

Figure 5A:
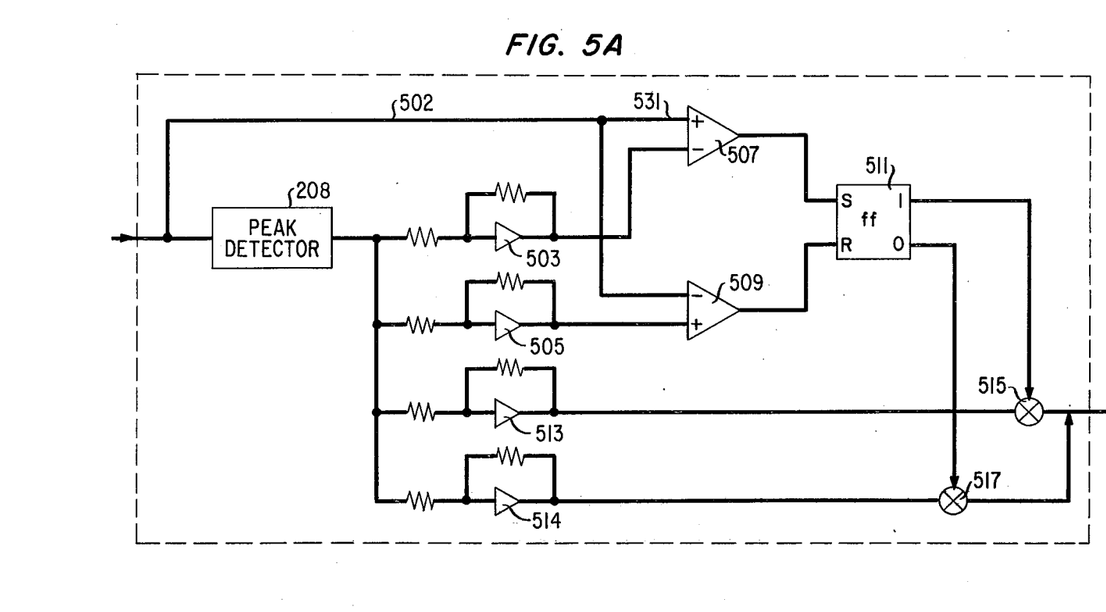
FIG. 5A shows an analog-type envelope signal threshold logic circuit which may be used in the circuits of FIGS. 1 and 2.

As shown in FIG. 2A, the $a_{max}$ signal obtained from the peak detector of FIG. 4 is applied to threshold logic 207. The output of low-pass filter 206 is also applied directly to threshold logic 207, which is shown in greater detail in FIG. 5A. Referring to FIG. 5A, the band limited envelope signal $a(t)$ from low-pass filter 204 appears on line 502. This signal is supplied to comparators 507 and 509. These comparators may comprise operational amplifiers or other circuits well known in the art. The envelope signal $a(t)$ is applied to the positive input of comparator 507 and to negative input of comparator 509 via leads 531 and 533, respectively. The negative input to comparator 507 is supplied via peak detector 208 and operational amplifier 503. As aforementioned, the output of peak detector 208 is the maximum amplitude $a_{max}$ of the envelope signal. Operational amplifier 503 is effective to provide a threshold level to the negative input of comparator 507 which is proportional to the signal $a_{max}$ in accordance with $$T_1 = L_1 a_{max} \tag{7}$$

where $L_1$ is the attenuation factor of operational amplifier 503. Thus comparator 507 compares the envelope signal $a(t)$ with threshold value $T_1$, which threshold value is proportional to $a_{max}$. For purposes of illustration, amplifier 503 may be designed to provide a threshold value of $1/50\ a_{max}$ to comparator 507. In accordance with the invention, when envelope signal $a(t)$ on line 502 increases above threshold value $T_1$, comparator 507 provides an output voltage which sets flip-flop 511.

The $a_{max}$ level from peak detector 208 is also supplied to the input of an operational amplifier 505, which amplifier is operative to provide threshold level $T_2 = L_2 a_{max}$ to the positive input of comparator 509. For purposes of illustration, operational amplifier 505 may be designed to produce an output which is $1/100$ of $a_{max}$ as threshold value $T_2$ to the positive input of comparator 509. In this manner, comparator 509 produces an output when the envelope signal $a(t)$ falls below threshold value $T_2$ provided by operational amplifier 505. The output of comparator 509 is effective to reset flip-flop 511.

After flip-flop 511 is set responsive to envelope signal $a(t)$ increasing above threshold level $T_1$, the one output of flip-flop 511 is operative to close switch 515 and the zero output of flip-flop 511 is operative to open switch 517. The output of peak detector 208 is modified by operational amplifier 513 to obtain the constant level signal $k_1$. This signal may be appropriately selected to be $1/40$ of $a_{max}$ by techniques well known in the art. The output of amplifier 513 is applied to one input of summing circuit 207 through switch 515. When flip-flop 511 is in the reset state responsive to the envelope signal decreasing below threshold value $T_2$, switch 515 is opened and switch 517 is closed. Amplifier 514 is operative to provide an output level $k_2$ which may be equal to $40\ a_{max}$. The $k_2$ output level is supplied to said one input of summing circuit 207. The other input of summing circuit 207 receives the envelope signal $a(t)$ so that the output of summing circuit 207 corresponds to Equation (2).

Figure 5B:
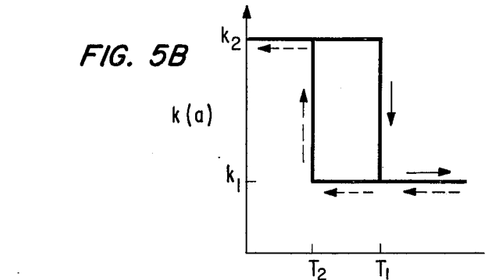
FIG. 5B illustrates the operation of the threshold logic of FIG. 5A.

FIG. 5B illustrates the operation of the hysteresis type threshold logic of FIG. 5A. As indicated in FIG. 5B, the output of the threshold logic is $k_2$ until the envelope signal increases above threshold $T_1$. After the envelope signal exceeds $T_1$ and while it remains above threshold $T_2$, the threshold logic output is $k_1$. The decrease of the envelope signal $a(t)$ below threshold $T_2$ after threshold $T_1$ has been exceeded causes threshold logic of FIG. 5A to provide an output $k_2$. The output remains $k_2$ as long as the envelope signal remains less than $T_1$. The hysteresis action provided by comparators 507 and 509 and flip-flop 511 and shown in FIG. 5B results in a large constant $k_2$ until a minimum envelope signal is obtained; a small constant $k_1$ when the envelope signal has exceeded its minimum acceptable threshold value $T_1$ and while it remains above the noise threshold value $T_2$. For the illustrative values given, $T_1$ is $2T_2$, while $k_1$ is $(1/1600)k_2$.

The output of summing circuit 209 in FIG. 2 is applied to the divider input of the divider circuit 215. Delay 212 retards the input speech signal $s(t)$ from filter 203 to take into account the response time of the circuit path including generator 205, filter 206, threshold logic 207, and sum circuit 209. The output of delay 212 is applied to the dividend input of divider 215, which divider, after band limiting by filter 220, provides output signal $$r(t) = s(t)/a(t) + K \tag{8}$$

where $K = k_1$ for $a(t) > T_1$, and where $K = k_2$ for $a(t) < T_2$. The output signal is bandwidth limited in filter 220 so that frequency components outside the range of 0 to W Hz are eliminated.

Since the output signal $r(t)$ from filter 220 has a substantially unilevel amplitude as shown in waveform 807, the transitions at the beginning points or termination points of the speech signal, or of pauses in said speech signal $s(t)$, are precisely defined. Signal detector 240, which may comprise logic circuitry well known in the art, receives signal $r(t)$ from filter 220 and is operative to detect the abrupt transitions between the unilevel amplitude of $r(t)$ during speech to the substantially zero level of $r(t)$ at the beginning or termination of the speech signal or pause boundaries therein.

A binary signal $x(t)$ shown in waveform 809 is produced by detector 240 responsive to said abrupt transitions, and this binary signal may be used to control switching apparatus in the communication network 260. For example, the signal conditioner of FIG. 2 may form part of a TASI system, well known in the art, wherein a plurality of signal conditioner output lines 250-1 through 250-n are connected to a common communication path through switching apparatus in network 280. The output of detector 240 and of similar detectors from other signal conditioners not shown can be utilized to selectively connect an active signal conditioner to the communication network. Alternatively, the signal conditioner can be utilized to detect pauses in a speech signal so that data or other signals may be interpolated therein. Advantageously, the abrupt transition points between speech and silence intervals obtained in the signal conditioner of FIG. 2A provides a highly precise indicating signal $x(t)$ which is not dependent on the dynamic characteristics of the incoming speech signal or the time constant characteristics of priorly known signal conditioners.

While the output signal $r(t)$ from the output of filter 220 is highly intelligible and may be directly used in a communication system, the replica $\tilde{s}(t)$ of the input speech signal $s(t)$ may be reconstructed from $r(t)$ by combining $r(t)$ from the output of filter 220 and signal $a(t)$ from the output of filter 206 in accordance with $$\tilde{s}(t) = r(t) \cdot a(t) \tag{9}$$

as can be readily seen from the expression for $r(t)$ in Equation (3). This may be done in multiplier 250 as illustrated in FIG. 2B.

Figure 3:
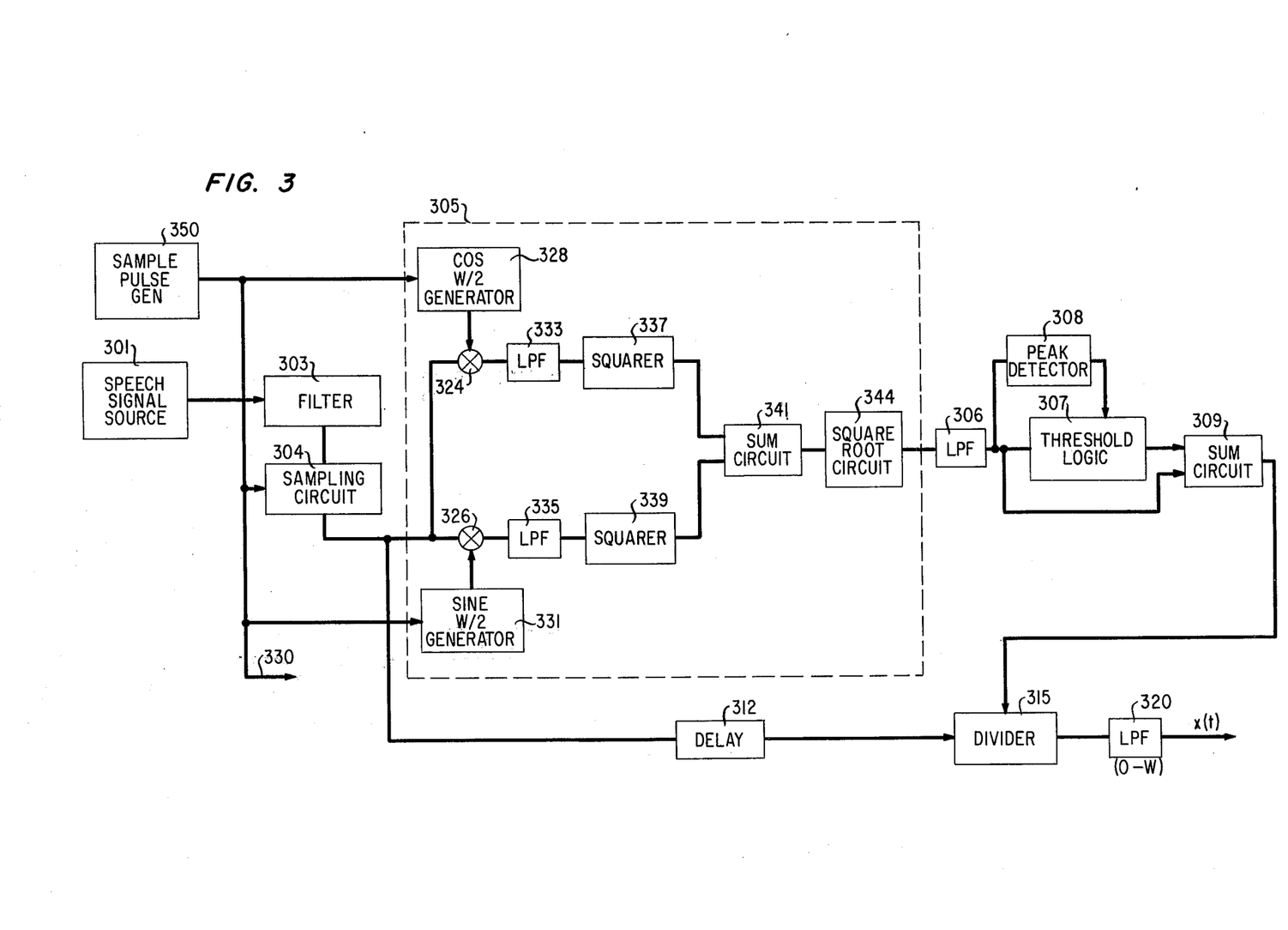
FIG. 3 depicts a block diagram of another signal amplitude adjustment circuit illustrative of the invention in which complex modulation is utilized.

FIG. 3 shows a digital type automatic signal amplitude equalizer circuit in which multiplication-type modulation is used to produce an envelope signal $a(t)$. In FIG. 3, signal source 301 operates to supply an analog speech-type signal $s(t)$ to filter circuit 303. Filter circuit 303 limits the bandwidth of signal $s(t)$ to the range between 0 and W Hz. Signal $s(t)$ is then applied from filter 303 to sampling circuit 304 which is operative responsive to pulses from generator 350 occurring at a rate of at least 2W per second to sample signal $s(t)$ and to produce a digitally coded signal for each sample $s_n(t)$.

The sequential coded samples $s_n(t)$ are applied to one input of multiplier 324 and to one input of multiplier 326 in envelope generator 305. Generator 328 produces coded samples corresponding to cosine $(W/2)t$ at a rate of 2W per second. Similarly, generator 331 produces coded samples corresponding to sine $(W/2)t$ at a rate of 2W per second. The output of generator 328 is applied to the other input of multiplier 324, which multiplier is operative to modulate signal $s(nT)$, whereby the coded signal $$p(nT) = s(nT) \cos(WnT/2); \quad T = 1/2W \tag{10}$$

is obtained. Similarly, multiplier 326 is jointly responsive to signal $s(nT)$ from sample circuit 304 and the coded signal $\sin(WnT/2)$ from generator 331 to produce coded signal $$q(nT) = s(nT) \sin(WnT/2) \tag{11}$$

The output of multiplier 324 is applied to low-pass filter 333 which has a predetermined impulse response $h_1(t)$, whereby it is adapted to limit the upper frequency of signal $p(nT)$ to W/2 Hz. In like manner, filter 335 limits the upper frequency of the signal $q(nT)$ from multiplier 326 to W/2 Hz. Digital squarer circuit 337 which may comprise a multiplier having two inputs connected together received the coded signal $p(nT)$ and responsive thereto produces the coded signal $p^2(nT)$. Digital squarer circuit 339 receives coded signal $q_n(t)$ from filter 335 and produces the coded signal $q^2(nT)$. The coded sum $$p^2(nT) + q^2(nT) \tag{12}$$

is formed in digital summing circuit 341, which sum is applied to square root circuit 334. Square root circuit 334 is then operative to form the coded envelope signal $a(nT)$ in accordance with $$a(nT) = \sqrt{p^2(nT) + q^2(nT)} \tag{13}$$

$a(nT)$ is a digitally coded representation of the envelope of the speech signal $s(t)$. Low-pass filter 306, having an impulse response $h_2(t)$, is adapted to limit the upper frequency of the envelope signal $a(nT)$. Where practically the upper frequency limit of $a(nT)$ is limited to W Hz, a digitally coded unilevel output signal may be obtained from divider 315. The upper frequency limit imposed by low-pass filter 306 may be less than W Hz, in which event some variation in the amplitude of the digitally coded signal from divider 315 is obtained.

Figure 6:
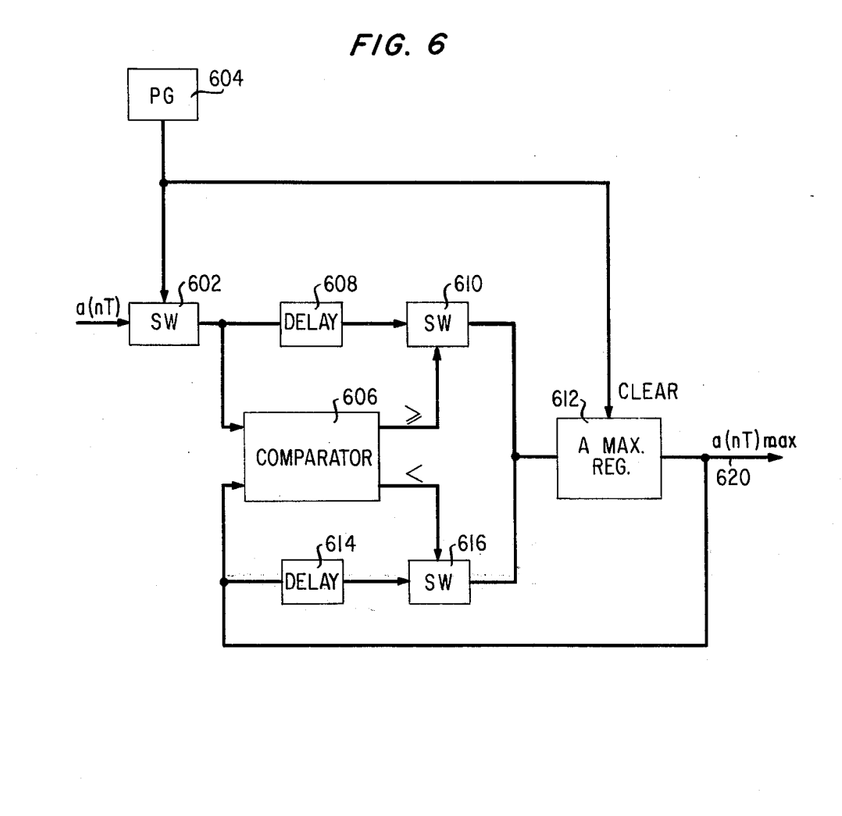
FIG. 6 shows a digital-type peak detector which may be used in the circuit of FIG. 3.

The coded signal $a(nT)$ from low-pass filter 306 is applied to peak detector 308 wherein the maximum $a(nT)$ code is stored for use in threshold logic 307. Peak detector 308 is shown in greater detail in FIG. 6. Referring to FIG. 6, the signal $a(nT)$ from filter 306 is applied to switch 602 which is closed in response to pulses from pulse generator 604. Pulse generator 604 is operative during selective periods of the incoming speech interval to permit the detection of the $a(nT)$max code.

Initially, register 612, which stores the $a(nT)$max code, is cleared by an output from pulse generator 604. The first envelope signal code $a(1\ T)$ is then applied to one input of comparator 606 via switch 602. The other input of comparator 606 receives the zero code from register 612. $a(1 \cdot T)$ is compared to the code from register 612. If, at the end of the comparison of $a(1 \cdot T)$ and the code from register 612, $a(1 \cdot T)$ is determined to be greater than or equal to the code from register 612, switch 610 is closed. The coded signal $a(1 \cdot T)$ delayed by delay 608 is then entered into register 612. Switch 616 remains open so that the original code from register 612 is discarded.

The coded signal $a(2 \cdot T)$ is then applied to comparator 606 in synchronism with the stored code in register 612 corresponding to a(1·T). At the end of the comparison, the greater of the two codes is entered into register 612 via switch 610 or switch 616 responsive to the state of comparator 606. As can be readily seen, the digital peak detector of FIG. 6 is operative to detect and store the maximum envelope signal code $a(nT)$max obtained from envelope generator 305. The output of register 612 is applied to threshold logic 307 which is shown in greater detail in FIG. 7.

Figure 7:
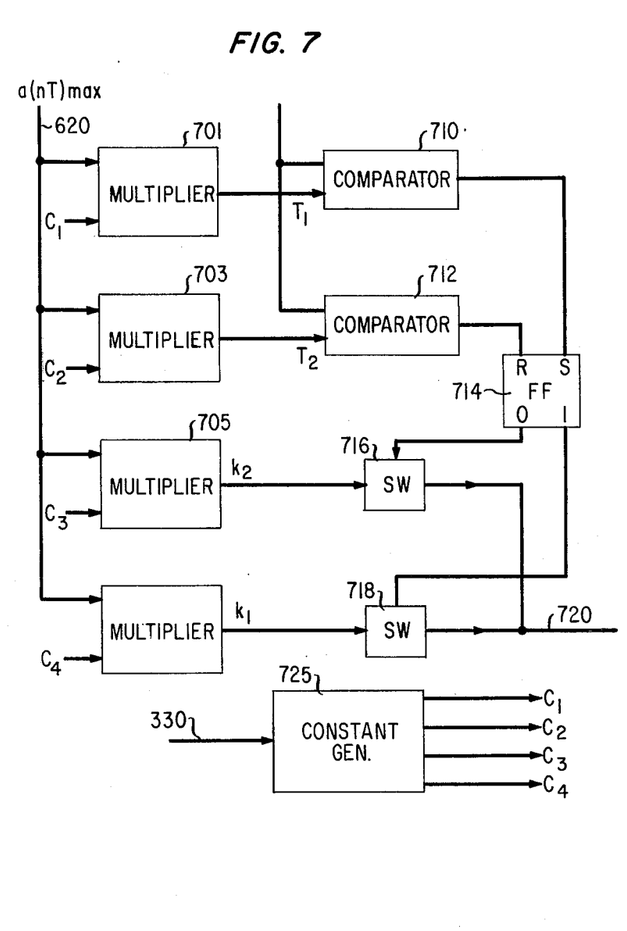
FIG. 7 shows a block diagram of a digital-type threshold logic circuit which may be used in the circuit of FIG. 3.

Referring to FIG. 7, the coded signals $a(nT)$ are sequentially applied from filter 306 to digital comparators 710 and 712. The $a(nT)$max code from register 612 of FIG. 6 is repetitively applied via lead 620 to digital multipliers 701, 703, 705, and 707. Constant codes C1 through C4 are repetitively generated in constant generator 725. Code C1 is supplied to multiplier 701 and which is operative to provide a threshold code $T_1$. Code $T_1$ is proportional to the $a(nT)$max code from peak detector 308. In like manner, the constant code C2 is applied to multiplier 703 so that a threshold $T_2 < T_1$ proportional to $a(nT)$ is obtained therefrom. This threshold $T_2$ is applied to one input of comparator 712.

The envelope signal codes $a(nT)$ are applied to comparator 710 which is operative to provide an output only when the code $a(nT)$ increases above the threshold code $T_1$. The output of comparator 710 causes flip-flop 714 to be set. In similar fashion, comparator 712 is operative to provide an output only when the $a(nT)$ codes decrease below the threshold code $T_2$. The output of comparator 712 is used to reset flip-flop 714.

The $a(nT)$max code on lead 620 is also applied to multipliers 705 and 707. Multiplier 707 is operative to multiply the $a(nT)$max code by constant C4 obtained from constant generator 725. Constant C4 is arranged so that the output of multiplier 707 is a constant $k_1$ proportional to $a(nT)$max. Similarly, multiplier 705 is operative to combine the $a(nT)$max code from lead 620 with a constant C3 from generator 725 so that a constant code $k_2$ proportional to $a(nT)$max is obtained from the output thereof.

When the envelope code $a(nT)$ increases above threshold code $T_1$, flip-flop 714 is set and the one output therefrom causes switch 718 to close so that the constant code $k_1$ is applied to lead 720. The zero output of flip-flop 714 at this time causes switch 716 to remain open, whereby the constant code $k_2$ is prevented from being applied to lead 720. When the envelope code $a(nT)$ decreases below threshold code $T_2$, flip-flop 714 is reset so that switch 716 is closed and switch 718 is maintained in its open position. In this manner, the constant $k_2$ is transferred to lead 720, but the constant $k_1$ is prevented from being applied thereto. Consequently, the output of threshold logic 307 is a constant code $k_1$ when the envelope signal code $a(nT)$ exceeds threshold value code $T_1$ and is $k_2$ when the envelope signal code $a(nT$ decreases below threshold value $T_2$.

The output of threshold logic 307 is applied to sum circuit 309 together with the envelope signal code $a(nT)$. The resulting digitally coded sum from the output of sum circuit 309 is applied to the divisor input of digital divider 315. The dividend input to divider 315 is obtained from sampling circuit 304 via delay 312. Delay 312 is is selected to delay the coded sample signal $s(nT)$ for a time corresponding to the delay through envelope generator 305, threshold logic 307, and sum circuit 309. As described with respect to FIG. 2, the output of divider 315 is a digital code.

$$r(nT) = s(nT)/a(nT)+k$$

where $k = k_1$ for $a(nT) > T_1$; $k = k_2$ for $a(nT) < T_2$

The sequence of digital codes on the output of divider 315 corresponds to a unilevel amplitude output signal which is band limited between 0 and W Hz in low-pass filter 320. The digital arithmetic and logic circuits used in FIGS. 3, 6 and 7 may be of the types described in "The Logic of Computer Arithmetic" by Ivan Flores, Prentice Hall Inc., 1963. In accordance with the invention, the signal $s(nT)$ is digitally processed in the circuit of FIG. 3 to obtain a substantially unilevel amplitude output signal $r(nT)$ only during signal intervals and so that automatic signal equalization is obtained.

The invention has been described in terms of particular illustrative embodiments. It is to be understood, however, that various modifications and changes may be made by those skilled in the art without departing from the spirit and scope of the invention.

What is claimed is:

1. A signal conditioning circuit comprising a speech signal source; means responsive to a speech signal from said source for generating a signal representative of the envelope of said speech signal; a first threshold source; a second threshold source, said second threshold being less than said first threshold; means for producing a level signal of first value responsive solely to said envelope representative signal exceeding said first threshold and remaining above said second threshold and of second value responsive solely to said envelope representative signal decreasing below said second threshold and remaining below said first threshold; means for combining said envelope representative signal and said level signal to form a modified envelope signal; and means for dividing said speech signal by said modified envelope signal to produce a substantially unilevel amplitude output signal when said first value level signal is generated and a substantially zero valued output signal when said second value level signal is generated.

2. A signal conditioning circuit according to claim 1 wherein said level signal producing means comprises first means for comparing said envelope-representative signal with said first threshold; second means for comparing said envelope-representative signal with said second threshold; a first value signal source; a second value signal source; means responsive to the operation of said first comparing means for applying said first value signal to said combining means when said envelope-representative signal exceeds said first threshold; and means for applying said second value signal to said combining means when said envelope-representative signal decreases below said second threshold.

3. A signal conditioning circuit according to claim 2 further comprising means for detecting and storing a third level signal representative of the maximum envelope representative signal in a selected time intervel.

4. A signal conditioning circuit according to claim 3 wherein said first threshold source comprises means responsive to said third signal for setting said first threshold, and said second threshold source comprises means responsive to said third signal for setting said second threshold.

5. A signal conditioning circuit according to claim 4 wherein said first threshold setting means comprises means responsive to said third signal for generating a first threshold proportional to said third signal, and said second threshold setting means comprises means responsive to said third signal for producing a second threshold proportional to said third signal.

6. A signal conditioning circuit according to claim 5 wherein said first value source comprises means responsive to said third signal for setting said first value signal, and means responsive to said third signal for setting said second value signal.

7. A signal conditioning circuit according to claim 6 wherein said first value setting means comprises means for generating a first value signal proportional to said third signal, and said second value setting means comprises means responsive to said third signal for generating a second value signal proportional to said third signal.

8. A signal conditioning circuit according to claim 1 wherein said envelope representative signal generating means comprises means for forming an analytic signal corresponding to said speech signal, and means responsive to said analytic signal for producing a signal representative of the absolute value of said analytic signal and said combining means comprises means for summing said envelope representative signal and said level signal.

9. A signal conditioning circuit according to claim 1 further comprising means responsive to said substantially unilevel amplitude output signal and said envelope representative signal for forming a replica of said input speech signal including means for forming a signal corresponding to the product of said envelope representative signal and said substantially unilevel amplitude output signal.

10. A signal conditioning circuit according to claim 1 wherein said envelope representative signal generating means comprises means responsive to said speech signal for forming a signal representative of the Hilbert transform of said speech signal; means for forming a first signal representative of the square of said Hilbert transform representative signal; means for forming a second signal representative of the square of said speech signal; means for summing said first and second signals; and means for forming a signal representative of the square root of the sum of said first and second signals.

11. A signal conditioning circuit according to claim 1, further comprising means for limiting the frequency range of said speech signal to a predetermined band and wherein said envelope representative signal generating means comprises means for generating a first signal corresponding to the product of said frequency-limited speech signal and a cosine wave of frequency equal to the midband frequency of said predetermined band; means for generating a second signal corresponding to the product of said band-limited speech signal and a sine wave of frequency equal to the midband frequency of said predetermined band; means for forming a third signal representative of the square of said first signal; means for forming a fourth signal representative of the square of said second signal; means for summing said third and fourth signals; and means for forming a signal representative of the square root of the sum of said third and fourth signals.

12. An amplitude equalizing circuit comprising means for receiving an input speech-like signal; means responsive to said input speech-like signal for generating an analytic signal of which said speech-like signal constitutes the real part, means responsive to said analytic signal for forming a first signal representative of the envelope of said speech-like signal; a first threshold source, a second threshold source, said first threshold being greater than said second threshold, means responsive solely to said first signal increasing above said first threshold and remaining above said second threshold for producing a first level signal; means responsive solely to said first signal decreasing below said second threshold and remaining below said first threshold for producing a second level signal; means for summing said first signal and the produced one of said first and second level signals to form a modified first signal; and means for forming an output signal corresponding to the ratio of the received input speech signal to said modified first signal, said output signal being a substantially parallel unilevel amplitude signal when said first level signal is produced and being a substantially zero valued signal when said second level signal is produced.

13. An amplitude equalizing circuit according to claim 12, further comprising means for detecting and storing a third level signal corresponding to the maximum first signal occurring in a selected time interval, and wherein said first level signal producing means comprises means for generating a level signal substantially less than said third signal, and said second level signal producing means comprising means for generating a level signal substantially greater than said third level signal.

14. An amplitude equalizing circuit according to claim 13 wherein said first level signal generating means comprises means responsive to said third signal for producing a level signal proportional to said third signal and said second level signal generating means comprises means for producing a level signal proportional to said third signal.

15. A circuit for transforming a speech signal into unilevel amplitude speech signal comprising means for receiving an input speech signal; means responsive to said received input speech signal for forming an analytic signal corresponding to said speech signal, means responsive to said analytic signal for generating a signal representative of the envelope of said speech signal; a first threshold level generator; a second threshold level generator, said second threshold level being less than said first threshold level; means solely responsive to said envelope representative signal exceeding said first threshold level and remaining greater than said second threshold level for producing a first constant value signal; means responsive to said envelope representative signal decreasing below said second threshold level and remaining less than said first threshold level for producing a second constant value signal; means for summing said envelope representative signal and the produced one of said first and second constant value signals to form a third signal; and means for dividing said received speech signal by said third signal to form a substantially unilevel amplitude speech signal when said first level signal is produced and a substantially zero level signal when said second level signal is produced.

16. A circuit for transforming a speech signal into a substantially unilevel amplitude speech signal according to claim 15 further comprising means responsive to the output of said dividing means for detecting the transitions between said substantially unilevel amplitude signal and said substantially zero level signal.

17. A circuit for transforming a speech signal into a unilevel amplitude speech signal according to claim 16 further comprising an output line, means for receiving at least one other input signal, means responsive to the detection of a transition from said unilevel amplitude speech signal to said zero level signal for applying said other input signal to said output line, and means responsive to the detection of a transition from said zero level signal to said unilevel amplitude signal for applying said unilevel amplitude signal to said output line.

18. A circuit for transforming a speech signal into a unilevel speech signal according to claim 15, further comprising means for detecting and storing the maximum envelope signal occurring in a selected time interval, and wherein each of said first and second threshold level generators comprises means responsive to said stored maximum envelope signal for producing a threshold level proportional to said maximum envelope signal.

19. A circuit for transforming a speech signal into unilevel amplitude speech signal according to claim 18 wherein said first constant value signal producing means comprises means responsive to said maximum envelope signal for generating a first constant value signal less than said maximum envelope signal, and said second constant value signal producing means comprises means responsive to said maximum envelope signal for generating a second constant value signal greater than said maximum envelope signal.

20. A method for transforming a speech signal into a substantially unilevel amplitude speech signal comprising the steps of receiving an input speech signal, forming a signal representative of the envelope of said input speech signal, generating first and second thresholds, said first threshold being greater than said second threshold, producing a first level signal responsive solely to said envelope representative signal exceeding said first threshold and remaining above said second threshold, producing a second level signal responsive solely to said envelope representative signal decreasing below said second threshold and remaining below said first threshold, combining said envelope signal with the produced one of said first and second level signals, and dividing said input speech signal by said combined signal to produce a substantially unilevel amplitude signal when said first level signal is produced and a substantially zero amplitude signal when said second level signal is produced.

* * * * *

UNITED STATES PATENT AND TRADEMARK OFFICE
CERTIFICATE OF CORRECTION

PATENT NO. : 4,071,695
DATED : January 31, 1978
INVENTOR(S) : James L. Flanagan and Susan A. Webber It is certified that error appears in the above-identified patent and that said Letters Patent are hereby corrected as shown below:

Column 1, line 7, "other other" should read --other--.

Column 9, line 56, "a(nT" should read --a(nT)--.

Column 9, line 63, second "is" should be deleted.

Column 10, Claim 3, line 57, "envelope representative" should read --envelope-representative--.

Column 12, Claim 12, line 13, "parallel" should be deleted.

Column 13, Claim 18, line 6, after "unilevel" insert --amplitude--.

Signed and Sealed this

Twelfth Day of June 1979

[SEAL]

Attest:

RUTH C. MASON
*Attesting Officer*

DONALD W. BANNER
*Commissioner of Patents and Trademarks*